(12) United States Patent
Milo et al.

(10) Patent No.: US 11,742,318 B2
(45) Date of Patent: Aug. 29, 2023

(54) SPLIT TIE BAR FOR CLIP STABILITY

(71) Applicant: Texas Instruments Incorporated, Dallas, TX (US)

(72) Inventors: Dolores Babaran Milo, Baguio (PH); Ernesto Pentecostes Rafael, Jr., Pampanga (PH); Michael Flores Milo, Baguio (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 71 days.

(21) Appl. No.: 17/239,053

(22) Filed: Apr. 23, 2021

(65) Prior Publication Data
US 2022/0344302 A1    Oct. 27, 2022

(51) Int. Cl.
| | |
|---|---|
| H01L 21/56 | (2006.01) |
| H01L 23/00 | (2006.01) |
| H01L 23/495 | (2006.01) |
| H01L 21/78 | (2006.01) |

(52) U.S. Cl.
CPC .............. *H01L 24/92* (2013.01); *H01L 21/56* (2013.01); *H01L 21/78* (2013.01); *H01L 23/49524* (2013.01); *H01L 23/49562* (2013.01); *H01L 24/97* (2013.01); *H01L 2224/92246* (2013.01)

(58) Field of Classification Search
CPC ......... H01L 24/92; H01L 21/56; H01L 21/78; H01L 23/49524; H01L 23/49562; H01L 24/97; H01L 2224/92246

USPC .......................................................... 438/123
See application file for complete search history.

(56) References Cited

U.S. PATENT DOCUMENTS

| | | | | |
|---|---|---|---|---|
| 8,354,740 | B2* | 1/2013 | Liu ....................... | H01L 21/50 |
| | | | | 257/E23.001 |
| 8,395,251 | B2* | 3/2013 | Shim ..................... | H01L 25/105 |
| | | | | 257/E23.048 |
| 8,680,658 | B2* | 3/2014 | Shi ....................... | H01L 24/73 |
| | | | | 257/E23.047 |
| 9,935,041 | B1* | 4/2018 | Lopez ................... | H01L 23/49541 |
| 10,896,864 | B2 | 1/2021 | Sinning et al. | |
| 11,355,470 | B2* | 6/2022 | Ryu ....................... | H01L 24/37 |
| 2020/0411421 | A1* | 12/2020 | Teysseyre ............. | H01L 23/3107 |
| 2021/0225744 | A1* | 7/2021 | Singer .................. | H01L 21/4842 |

* cited by examiner

*Primary Examiner* — Vu A Vu
(74) *Attorney, Agent, or Firm* — Ronald O. Neerings; Frank D. Cimino

(57) ABSTRACT

A gang clip includes a plurality of clips formed from a metal each having a center region oriented along a first plane and an angled clip foot having a foot height, a length and a bend angle sufficient to electrically contact a lead terminal of the leadframe to be used to form a device. Adjacent ones of the plurality of clips are joined to one another by a first tie bar also oriented along the first plane. The first tie bar extends to a saw street region located between adjacent ones of the clips. A second tie bar attached to the first tie bar is positioned in the saw street region.

19 Claims, 3 Drawing Sheets

SPLIT TIE BAR FOR CLIP STABILITY

FIELD

This Disclosure relates to semiconductor devices and processes, and more specifically to clips used in semiconductor device assembly.

BACKGROUND

The performance of semiconductor devices such as power supply systems and DC/DC converters depends to some extent on the magnitude of parasitic resistances and inductances. In order to reduce the value of these parasitic parameters, some semiconductor devices have replaced their traditional connections using bond wires by connections using relatively thick and large area metal clips, since it is known that due to their lengths and electrical resistances, thin and long bonding wires introduce significant parasitic resistances and inductances into the power circuit, while metal clips being relatively thick and large area contribute significantly lower parasitic resistances and inductances. As an example, in recently introduced semiconductor power supply systems, clips substitute for a plurality of bond wires. For their function, clips are wide and thick metallic pieces typically shaped as a flat connector with an angled ridge commonly referred to as a clip foot configured to reach leads of a leadframe. Due to their low electrical resistance and high thermal conductance, clips have significantly reduced parasitic resistance and inductance, and because of their high thermal conductivity also provide enhanced heat dissipation.

In order to simplify the assembly processes of semiconductor power supply systems and keep assembly fabrication costs low, it is advantageous to perform the assembly of clips as a batch process in a wafer-level like fabrication flow. Referring to the batch process, a plurality of interconnected clips suitable for this process is often called a "gang clip" (or clip array). For the batch process of available production, clips of the gang clip are held together by an outer frame. Inside that frame, each clip of the gang clip is positioned within a discrete rectangle of tie rails, held in precise position by tie bars to the tie rails. Each clip shares its tie rails with the nearest adjacent clips. The network of clips within the outer frame is manufactured from a single sheet of metal, typically copper. Since the clips are fastened by tie bars within their respective tie rail rectangle, the clips can be assembled with precision to semiconductor die during the assembly flow of the system-under-construction. The distal portion of the tie rails and the tie rail rectangles are removed by sawing after the plastic encapsulation (molding) process.

For semiconductor packages having two or more vertically stacked die, such as power device packages comprising a vertical power semiconductor device comprising a Metal Oxide Semiconductor Field Effect Transistor (MOSFET, or simply a vertical FET) die or Isolated Gate Bipolar Transistor (IGBT) die, the semiconductor package may include a top clip and a bottom clip that are configured to be stacked on one another. Clips enable creating a direct electrical and heat transfer path from the drain and source sides of a vertical MOSFET or IGBT to leads of the leadframe to improve switching times and also improve heat management.

FIG. 1 is a cross-sectional view of an example packaged power device 100 including a leadframe shown as LF 110 comprising a die pad 111 and lead terminals both shown as 112 on the bottom. The LF 110 can comprises a leaded leadframe or a leadless leadframe such as a quad flat no leads (QFN) LF. There is a bottom vertical FET 140 on the die pad 111, a bottom clip 125 having a clip foot 126 on top of the bottom FET 140, a top vertical FET 150 on the bottom clip 125, and a top clip 135 having a clip foot 136 on top of the top FET 150. The respective clip foot 126, 136 can be seen to have a bend that along with their sufficient length extends to enable a connection to be made to the lead terminals 112, generally by using a solder material in between. Although the top clip 135 and the bottom clip 125 are both shown having their respective clip foot 136, 126 as separate features solely for feature identification by the vertical lines between them, they are a single (integral) piece of metal because they are fabricated as one single piece of metal, which also provides their respective TC tie bars 137, 127. FIG. 1 shows solder 131 is on the bottom of the clip foot 126, 136, above and below the top FET 150, and above the bottom FET 140, for the respective electrical connections of the packaged power device 100. On a bottom surface of the bottom FET 140 is an electrically and thermally conductive die attach material 141, such as a metal filled epoxy or solder.

The packaged power device 100 is also shown including a mold compound shown as mold 146. On the distal ends of the top clip 135 and bottom clip 125 there can be seen to be tie bars shown as a top clip (TC) tie bar 137 and a bottom clip (BC) tie bar 127 that are located on an opposite side of the clips 135, 125 with respect to their respective clip foots 136, 126. A cross-sectional of the packaged power device 100 viewed 90° in the plane of the clips to the view provided in FIG. 1 would reveal the tie bars 127, 137 being located in positions that can optionally be in-between the lead terminals 112.

Clip attach processing for a power device package generally comprises dispensing solder to both the leadframe and the vertical FET (or IGBT) die surfaces. Initially, for a single clip power device package, conventionally called a discrete clip package or simply a device, solder is dispensed on top of the leadframe's die pad where the drain side of the bottom vertical FET die is attached. A second round of solder dispense is performed on the top surface of the vertical FET die which is then be attached using a clip, generally copper, forming a direct electrical path between the lead terminals and the vertical FET die. The lead terminals are generally exposed from the mold compound (generally referred to as a thermal pad or a power pad) configured to more efficiently sink off excess heat generated by the FETs during operation of the power device package. This clip package arrangement allows for greater package reliability, better thermal transfer, and due to lower package parasitics, faster device switching.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects recognize during singulation of a semiconductor power package comprising a first power device and second power device including a bottom clip (first clip) and a top clip (second clip), metal from the top tie bar (shown as TC tie bar 137 in FIG. 1 described above) on the end of the top clip can be shifted (bent) along the side of the package in a direction towards the bottom tie bar (shown as BC tie bar 127 in FIG. 1 described above) on the end of bottom clip. The narrowing of the gap can result in device terminal shorting (or a high-level of leakage between terminals), and thus can cause a reduction in power device package test yield. It is recognized that the tie bars can be unintentionally bent during assembly in some cases downward which as described above can create a test yield problem, which has been found to be induced by stresses induced by assembly processes before package saw/singulation, found to be occurring during assembly processing between the clip attaching to the molding.

Disclosed aspects solve this tie bar bending problem for each clip in a gang clip comprising a plurality of interconnected clips, which can be applied to both the bottom clip and top clip for use in a semiconductor power package having first and second power devices, by adding an extra tie bar that is positioned adjacent to the conventional single tie bar that may be referred to herein as a first tie bar for each clip. The extra tie bars are referred to herein as being "dummy tie bars" that may be also referred to as second tie bars in the claims to differentiate from the conventional first type bars, because the dummy tie bars are positioned within the saw street (or saw line), so that the dummy tie bars are removed by package saw/singulation. The dummy tie bar is generally positioned on an outer lead portion for mechanical support, where the outer lead portion and the dummy tie bar or both removed during package singulation.

The first tie bar and the dummy/second tie bar collectively may be referred to herein as a "split tie bar". Disclosed split tie bars including a dummy tie bar have been found to eliminate the risk of clips causing shorts or device leakage by being configured to provide additional mechanical support by acting as a spacer (or as a staff) to help prevent downward bending of the tie bar and associated first tie bar deformation that can be induced during power device package assembly for power device packages including clip(s).

Disclosed aspects include a gang clip comprising a plurality of clips comprising a metal (or metal alloy) each having a center region oriented along a first plane and an angled clip foot having a foot height, a foot length, and a bend angle sufficient to electrically contact a lead terminal of a leadframe to be used to form a device, wherein adjacent clips are joined to one another by a first tie bar that is also oriented along the first plane. The first tie bar extends to a saw street region located between adjacent ones of the clips. A dummy tie bar is attached to the first tie bar that is positioned in the saw street region which is attached (generally being integrally attached) to the first tie bar.

The dummy tie bar can have a length within 10% of the foot height. The dummy tie bar can be oriented in a direction essentially perpendicular relative to the first plane being at an angle of 90° plus or minus −5° and can have a rectangular shape and a width between 100 μm and 300 μm. In the case that respective clips each include a plurality of dummy tie bars, one of the dummy tie bars can be positioned on a side that is opposite relative to the clip foot.

BRIEF DESCRIPTION OF THE DRAWINGS

Reference will now be made to the accompanying drawings, which are not necessarily drawn to scale, wherein.

DETAILED DESCRIPTION

Figure 1:
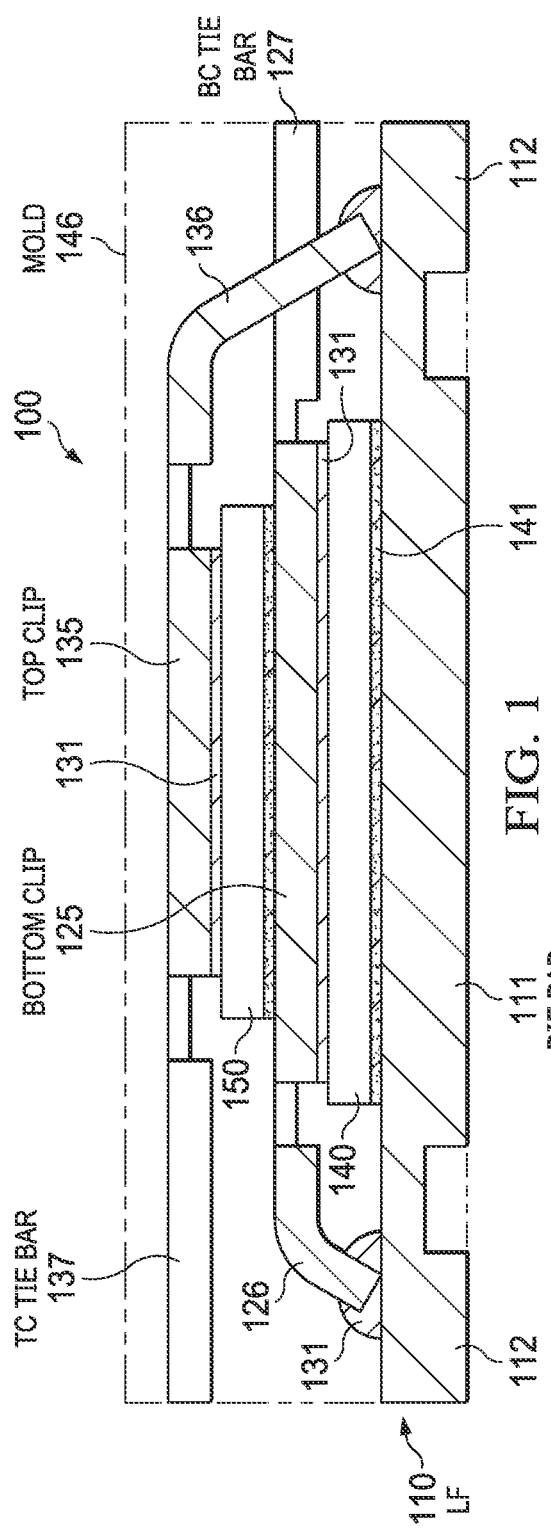
FIG. 1 is an example packaged power device comprising a leadframe including a die pad on the bottom, a bottom vertical FET on the die pad, a bottom clip on top of the bottom FET, a top vertical FET on the bottom clip, and a top clip on top of the top FET. On the ends of the top and bottom clips there can be seen to be conventional tie bars shown as a TC tie bar and a BC tie bar.

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

For the purposes of this detailed description, the terms clip and gang clip will be understood to refer to preformed conductive interconnects of a power transistor module, which are attached to a power transistor after the power transistor is singulated from a semiconductor wafer comprising a plurality of power transistor die. A clip may be provided as a piece part, while a gang clip is generally provided as a unit of a network (or array) held together by connecting bars, which will be trimmed at time of package singulation. As further practiced herein, the term tie rail is applied to a metallic connection, which is removed in the singulation process (for instance by sawing), while the term tie bar is applied to a metallic connection, which in the case of the first tie bar (but not the dummy tie bar) will be severed in the saw street region, but remains in part after the singulation process.

The metal for the clip including the split tie bar as noted above may comprise copper, is generally in the thickness range from about 0.1 to 0.3 mm, such as about 0.125 or 0.25 mm thick. Copper is known to have high electrical and high thermal conductivity, suitable for semiconductor devices and especially power transistors. Alternative metals include aluminum and iron-nickel alloys. At least one surface, such as both surfaces, of the clip may have a metallurgical coating preparation to be solderable. One example metallurgical preparation technique comprises the deposition of a layer of tin or a consecutive sequence of layers of nickel, palladium, and (for some devices) gold.

Figure 2:
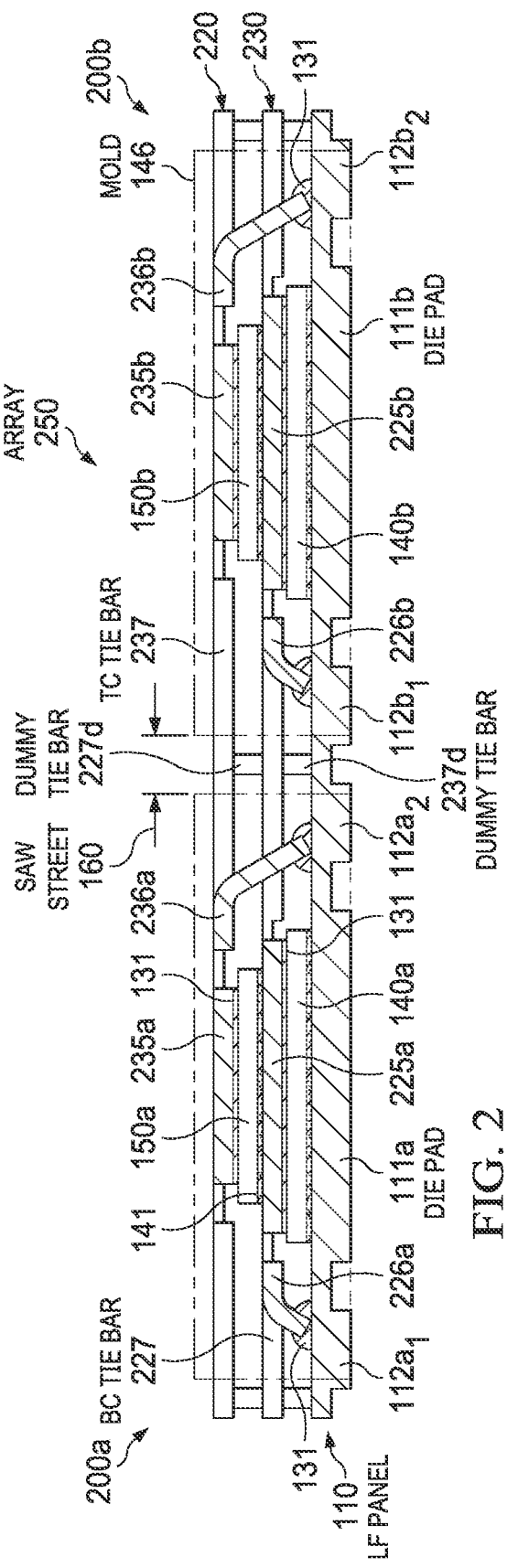
FIG. 2 shows a portion of an array of pre-singulated (interconnected) packaged power devices including a top and a bottom vertical FET that include disclosed clips having split tie bars. A top gang clip provides a top clip for each packaged power device and a bottom gang clip that provides a bottom clip for each packaged power device. The adjacent clips for each gang clip are attached to one another by first tie bars, shown as TC tie bar that includes a dummy tie bar, and a BC tie bar that also includes a dummy tie bar. The dummy tie bars can be seen to be positioned within the saw street region (saw line) which represents the area that will be removed by the final package saw step.

FIG. 2 shows a portion of an array 250 of pre-singulated (interconnected) packaged power devices shown as packaged power device 200a and 200b that each include clips including disclosed split tie bars. In a typical assembly, there will be several hundred or several thousand pre-singulated (physically interconnected) packaged power devices. A top gang clip 220 provides a top clip for each packaged power device 200a, 200b shown as top clip 235a ("a" used for packaged power device 200a) including a clip foot 236a, 236b ("b" used for packaged power device 200b), and a bottom gang clip 230 that provides a bottom clip shown as 225a and 225b including a clip foot 226a, 226b. As noted above relative to FIG. 1, although the top clips 235a and 235b and the bottom clips 225a and 225b, are all shown having their respective features shown separated by the vertical lines between them, they are all one single piece of metal which provides their respective tie TC tie bars 237a, 237b, and respective BC tie bars 227a, 227b, and their respective clip foot 236a, 236b, and 226a, 226b. Moreover, the dummy tie bars 237d, 227d are also formed from the same single piece of metal as their respective clips.

The adjacent clips for each gang clip 220, 230 are attached to one another by tie bars, shown as TC tie bar 237a that includes a dummy tie bar 237d for gang clip 230, and a BC tie bar 227b that includes a dummy tie bar 227d for gang clip 220. The dummy tie bars 227d, 237d are shown bent about 90° (oriented into the page, generally 90° plus or minus 5°) relative to a plane of the clips 235a, 235b, 225a, 225b and the BC tie bar 227 and TC tie bar 237. For a 350 µm wide saw street with a 200 µm tie bar width, a maximum angle which will not overlap the tie bar is about 96° at an ideal condition.

There is a top vertical FET 150a, 150b and a bottom vertical FET 140a, 140b. There is also a LF panel 210 including LF 210a and LF 210b, where the bottom FETs 140a, 140b are on the die pads 111a, 111b. The dummy tie bars 227d, 237d can be seen to be positioned within the saw street region (saw line) 160 which represents the area that will be removed by the final package sawing step. As in FIG. 1 for the packaged power device 100, solder 131 is on the bottom of the clip foot 226a, 226b, and clip foot 236a, 236b, above and below the top FET 150a, 150b, and above the bottom FET 140a, 140b for the respective electrical connections for the pre-singulated packaged power devices.

Figure 3A:
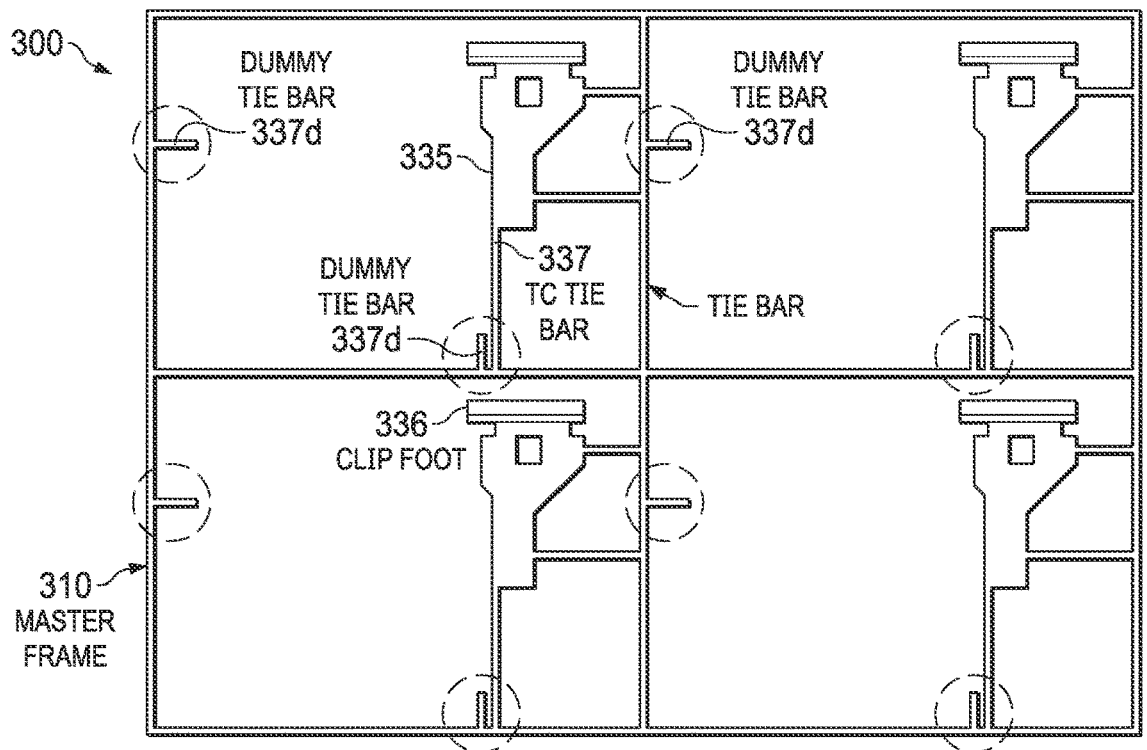
FIG. 3A shows a perspective view of a portion of a gang clip following a metal etching or other metal patterning step that defines the features of a disclosed clip including a split tie bar comprising a first tie bar and a dummy tie bar.

FIG. 3A shows a perspective view of a portion of a disclosed gang clip 300 following a metal etching or other metal patterning step, such as using a stamping, or a bending process that defines the features of a disclosed clip including a split tie bar comprising what is shown by example as TC tie bar 337 and disclosed dummy tie bars each shown as 337d. One of the dummy tie bars 337d is shown on a side (shown on a left side) that is opposite relative to the clip foot 336 (shown on the right side). The clip is shown as 335, and its clip foot shown as 336. The master frame is shown as 310.

Conventional metal etching can be used to form disclosed clips generally comprising chemical etching with an etching mask that is fabricated, and the etching mask is used to etch the pattern on leadframe sheets that generally comprise copper or copper alloy, where non-exposed metal areas are etched out (or removed) after the chemical etching. In the etching of the gang clip, split tie bars are formed comprising conventional tie bars shown as TC tie bar 337 as well as disclosed dummy tie bars 337d which can be fabricated in the same way as the other clip features. The length of dummy tie bar 337d will generally be based on the clip foot's 336 height after being bent which may be referred to herein as being the bend height. After the etching, the dummy tie bars 337d remain oriented in the plane of the clips.

One generally designs the length of the dummy tie bar 337d to be the same as the clip foot's 336 bend height, generally designed to be equal to the bend height, and as a result generally within a range of plus or minus 10% relative to that, which helps ensure that additional rejects are not induced for the semiconductor power package. If the dummy tie bar 337d is too long relative to the clip foot's 336 bend height, the TC tie bar 337 will be positioned higher in the package as a result, and this can cause a weak (or no) electrical connection of the clip foot 336 to the lead terminal due to the forcing the clip foot 336 upwards. If the dummy tie bar 337d is too short relative to clip foot's 336 bend height, the TC tie bar 337 can be displaced downward during the assembly process.

Figure 3B:
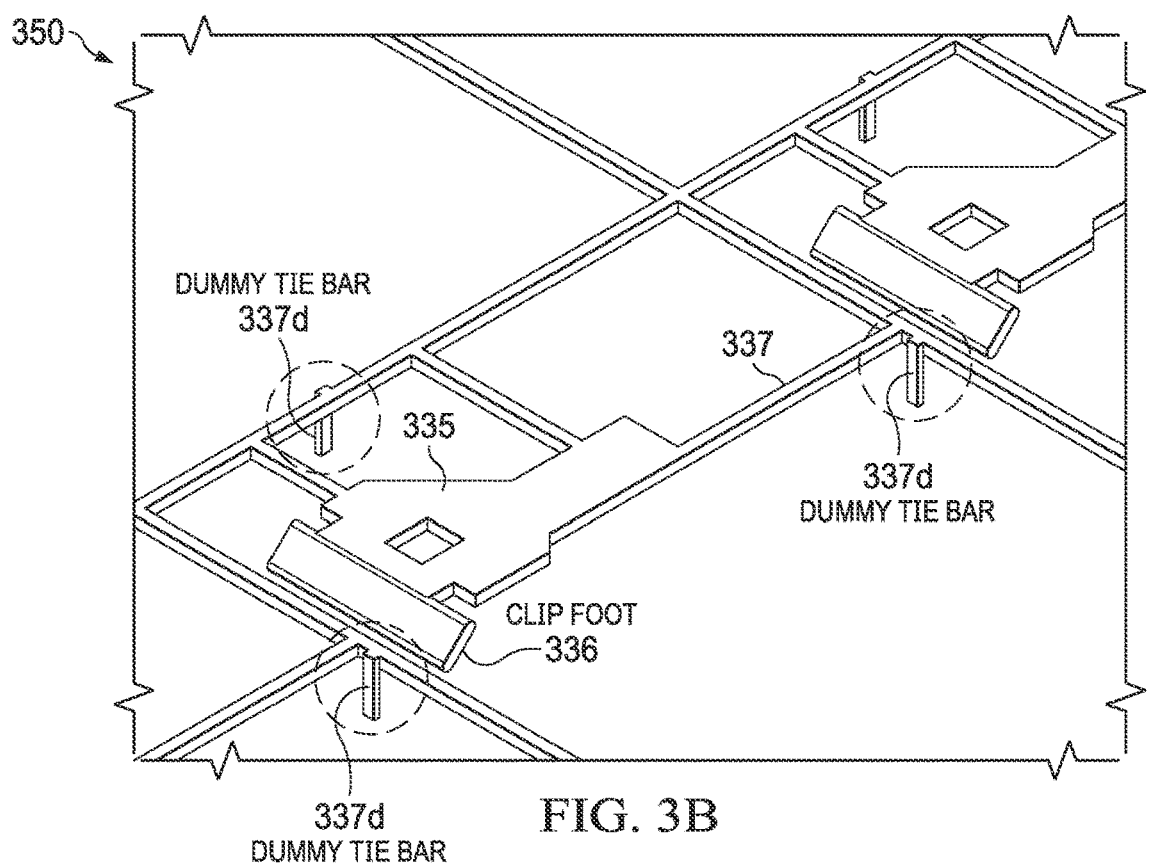
FIG. 3B shows a perspective view of a portion of a gang clip following the metal bending step that results in the dummy tie bars being bent at about 90° relative to the first tie bar and the plane of the clip.

FIG. 3B shows a perspective view of a portion of a gang clip 350 following a metal bending step that results in the dummy tie bars 337d being bent at about 90° relative to the plane of the clip 335 and the first tie bar shown as the TC tie bar 337. Bending of the dummy tie bar 337d will generally be performed at the same time as the bending up of the clip foot 336 so that no additional processing is needed due to the addition of the dummy tie bars. Bending of the dummy tie bars 337d is generally provided by a conventional bending process, where 2 separate tools or metals (one to hold and one to bend) are generally used to provide the designed shape for the dummy tie bar 337d and its bend angle.

An angle of about 90 degrees for the dummy tie bar 337d relative to the plane of the tie bar 337 helps ensure that there is no unwanted exposed metal (e.g., Cu) after sawing. With an angle of about 90° for the dummy tie bars 337d relative to the plane of the tie bar 337 one can generally ensure that the metals are fully removed as they are located only in the saw street area. At another angle besides about 90°, it is recognized that one cannot be sure if there are part(s) of the dummy tie bar 337d which will extend beyond the saw street which can cause unwanted metal that can risk shorting by remaining after sawing/device singulation.

Figure 4:
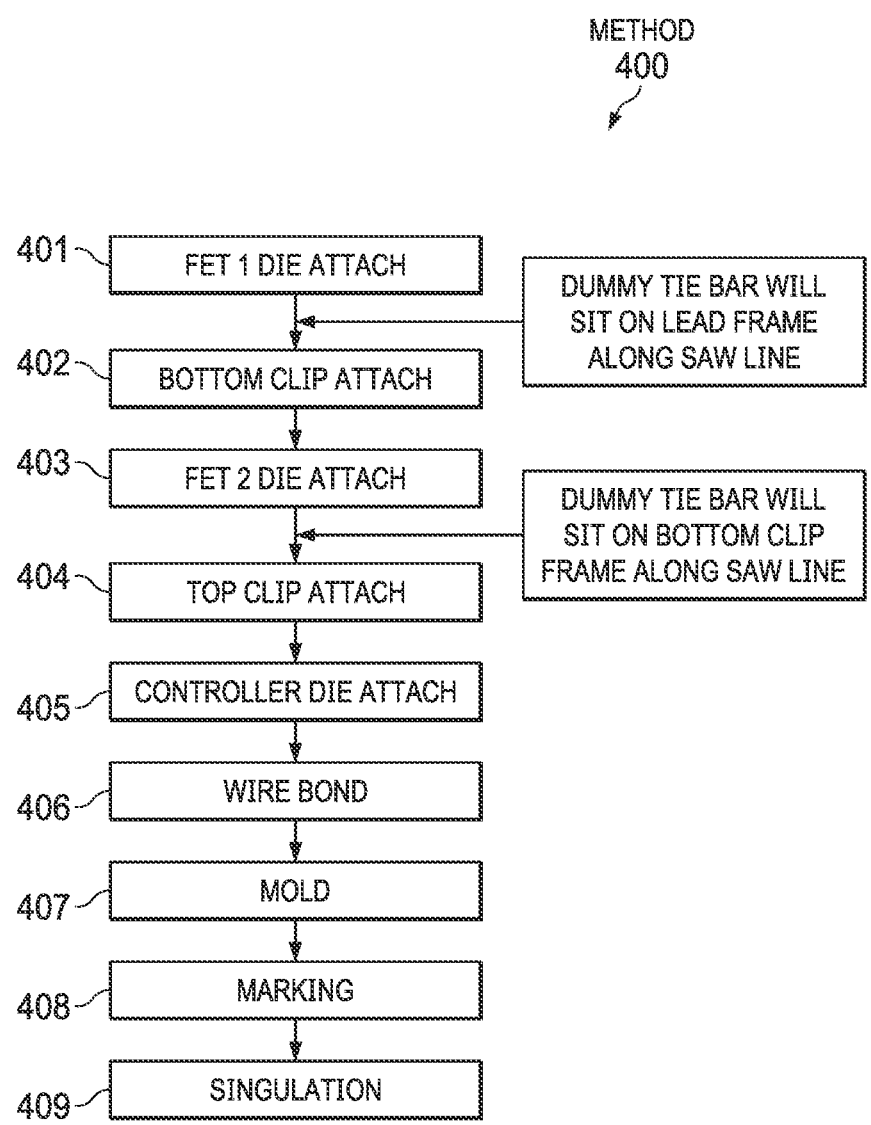
FIG. 4 shows steps in an example method for forming a packaged power device that includes an optional controller die including disclosed clips having split tie bars including a dummy tie bar for assembling stacked vertical power semiconductor devices described as being vertical FETs, according to an example aspect.

FIG. 4 shows steps in an example method 400 for forming a packaged power device that includes an optional controller die, including disclosed clips having dummy tie bars for assembling stacked power semiconductor devices described by example as being vertical FETs, according to an example aspect. As noted above, the vertical power semiconductor devices can also comprise IGBT's. Moreover, disclosed methods include a method for forming a packaged power device that includes a single power semiconductor device using a single disclosed clip.

Step 401 comprises attaching a bottom side of first vertical FET to a first die pad of a leadframe, generally with electrically conductive die attach material, such as a silver particle filled epoxy. Step 402 comprises attaching a bottom clip over the top of the first vertical FET. Solder is generally used for this attachment. As noted in FIG. 4 and described above, the dummy tie bar will be positioned on the leadframe in the saw street region and thus in the saw line. Step 403 comprises die attaching a bottom side of a second vertical FET to the top of the bottom clip. Solder is generally used for this attachment. However, solder is not needed for the dummy tie bar because as described above the dummy tie bar being in the saw street region is removed upon singulating the packages.

Step 404 comprises attaching a top clip on a top side of the second vertical FET. As noted in FIG. 4, the dummy tie bar will sit on the leadframe along the saw line. Solder is generally used for this attachment. Step 405 comprises die attaching a controller die generally topside up to a second die pad of the leadframe that is positioned lateral to the first die pad. A conventional die attach material or a conductive die attach material may be used for this attachment. Step 406 comprises wirebonding between bond pads on the controller die and the top and the bottom vertical FET as well as to the lead terminals of the leadframe. Step 407 comprises molding. Step 408 comprises marking the packages. Step 409 comprises singulating the packaged power devices to provide individual packaged power packages by sawing through a full thickness in the saw street region.

Advantages of disclosed clips having split tie bars comprising a first tie bar and a disclosed dummy tie bar include no change in clip fabrication, generally being gang clip fabrication involving metal etching and then bending. The disclosed clip design including a disclosed split tie bar comprising a dummy tie bar as noted above can be implemented by standard etching and bending process of clip. One can maintain a gang clip design for single clip attach process per leadframe panel which is helpful because use of singulated clips will generally involve multiple pick and place. No changes are needed in current clip processing. Use of disclosed split tie bars will essentially eliminate the risk of clip-to-clip (or clip to lead) shorting or high leakage.

Disclosed aspects can be integrated into a variety of assembly flows to form a variety of different packaged power devices and related products. A variety of package substrates may be used. The die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the die can be formed from a variety of processes including bipolar, insulated-gate bipolar transistor (IGBT), CMOS, BiCMOS and MEMS.

Those skilled in the art to which this Disclosure relates will appreciate that many variations of disclosed aspects are possible within the scope of the claimed invention, and further additions, deletions, substitutions and modifications may be made to the above-described aspects without departing from the scope of this Disclosure.

The invention claimed is:

1. A gang clip, comprising:
a plurality of clips comprising a metal each having a center region oriented along a first plane and an angled clip foot having a foot height, a foot length and a bend angle sufficient to make an electrically contact to a lead terminal of a leadframe to be used to form a device, wherein adjacent ones of the plurality of clips are joined to one another by a first tie bar also oriented along the first plane;
the first tie bar extending to a saw street region located between adjacent ones of the plurality of clips; and
a second tie bar attached to the first tie bar positioned in the saw street region, wherein the second tie bar has a rectangular shape and a width between 100 µm and 300 µm.

2. The gang clip of claim 1, wherein the second tie bar has a length within 10% of the clip height.

3. The gang clip of claim 1, wherein the second tie bar is integral with the first tie bar.

4. The gang clip of claim 1, wherein the second tie bar is oriented in a direction essentially perpendicular relative to the first plane being at an angle of 90° plus or minus −5°.

5. The gang clip of claim 1, wherein the plurality of clips each include the first tie bar along a first direction of the first plane, and the second tie bar along a second direction of the first plane perpendicular to the first direction.

6. The gang clip of claim 5, wherein one of the tie bars is positioned on a side that is opposite relative to the clip foot.

7. A method of assembling a packaged power device, comprising:
attaching a power semiconductor device comprising a vertical field effect transistor (FET) or an Isolated Gate Bipolar Transistor (IGBT) to a die pad of a leadframe that also includes lead terminals;
attaching a first clip to the lead terminals, wherein the first clip comprising a metal having a center region oriented along a first plane and an angled clip foot having a foot height, a foot length and a bend angle sufficient to electrically contact the lead terminals, a first tie bar connected to the first clip also oriented along the first plane and extending to a saw street region, a second tie bar attached to the first tie bar positioned in the saw street region, and the second tie bar physically contacts the leadframe in the saw street region; and
covering the packaged power device with a mold compound.

8. The method of claim 7, wherein the second tie bar has a length within 10% of the foot height.

9. The method of claim 7, wherein the second tie bar is oriented in a direction essentially perpendicular relative to the first plane being at an angle of 90° plus or minus −5°.

10. The method of claim 7, wherein the first tie bar is along a first direction of the first plane, and a the second tie bar is along a second direction of the first plane perpendicular to the first direction.

11. The method of claim 7, wherein the second tie bar is positioned on a side that is opposite relative to the clip foot.

12. A method of assembling a packaged power device, comprising:
attaching a first power semiconductor device comprising a first vertical field effect transistor (FET) or a first Isolated Gate Bipolar Transistor (IGBT) to a first die pad of a leadframe that also includes lead terminals;
attaching a first clip to the lead terminals, wherein the first clip comprising a metal having a center region oriented along a first plane and an angled bottom clip foot having a bottom foot height, a bottom foot length and a bottom bend angle sufficient to electrically contact the lead terminals, a first bottom tie bar connected to the first clip also oriented along the first plane and extending to a saw street region, a second bottom tie bar attached to the first tie bar positioned in the saw street region, and the second bottom tie bar physically contacts the leadframe in the saw street region;
attaching a second power semiconductor device comprising a second vertical FET or a second IGBT on the first clip;
attaching a second clip over the second power semiconductor device comprising a metal having a center region oriented along the first plane and an angled top clip foot having a top foot height, a top foot length and a top bend angle sufficient to electrically contact the lead terminals, with a first top tie bar connected to the second clip also oriented along the first plane and extending to the saw street region, a second top tie bar attached to the second bottom tie bar positioned in the saw street region, wherein the second top tie bar physically contacts the first clip in the saw street region; and covering the power device with a mold material.

13. The method of claim 12, wherein the first clip and the second clip are both part of a respective gang clip so that a plurality of the packaged power devices are formed by the method, further comprising singulating including sawing through the saw street region to form a plurality of the power packaged devices.

14. The method of claim 12, wherein the leadframe comprises a leadless leadframe.

15. The method of claim 12, wherein the second bottom tie bar and second top tie bar both have a length within 10% of their respective foot height.

16. The method of claim 12, wherein the attaching of the first clip, the second power semiconductor device, and the second clip all comprises forming solder connections.

17. The method of claim 12, wherein the first power semiconductor device comprises the first vertical FET and wherein the second power semiconductor device comprises the second vertical FET.

18. The method of claim 12, wherein the first power semiconductor device comprises the first IGBT and wherein the second power semiconductor device comprises the second IGBT.

19. A method of assembling a packaged power device, comprising:

attaching a first power semiconductor device comprising a first vertical field effect transistor (FET) or a first Isolated Gate Bipolar Transistor (IGBT) to a first die pad of a leadframe that also includes lead terminals;

attaching a first clip to the lead terminals, wherein the first clip comprising a metal having a center region oriented along a first plane and an angled bottom clip foot having a bottom foot height, a bottom foot length and a bottom bend angle sufficient to electrically contact the lead terminals, a first bottom tie bar connected to the first clip also oriented along the first plane and extending to a saw street region, a second bottom tie bar attached to the first bottom tie bar positioned in the saw street region, and the second bottom tie bar physically contacts the leadframe in the saw street region;

attaching a second power semiconductor device comprising a second vertical FET or a second IGBT on the first clip;

attaching a second clip over the second power semiconductor device comprising a metal having a center region oriented along the first plane and an angled top clip foot having a top foot height, a top foot length and a top bend angle sufficient to electrically contact the lead terminals, with a first top tie bar connected to the second clip also oriented along the first plane and extending to the saw street region, a second top tie bar attached to the second bottom tie bar positioned in the saw street region, wherein the second top tie bar physically contacts the first clip in the saw street region;

positioning a second die pad lateral to the first die pad;

attaching a controller die with its top side having bond pads up to the second die pad;

bonding wires between the bond pads and leads of the leadframe that are electrically connected to terminals of the first power semiconductor device by the first clip and to terminals of the second power semiconductor device by the second clip; and covering the power device with a mold material.

\* \* \* \* \*